Dec. 15, 1970 W. N. LAWRIE, JR., ET AL 3,548,219

SEMICONDUCTOR PULSE AMPLIFIER

Filed Sept. 17, 1968

INVENTORS.
WILLIAM N. LAWRIE, JR.
ILAN ZISKIND
BY Jewel J. Schneider
AGENT

United States Patent Office 3,548,219
Patented Dec. 15, 1970

3,548,219
SEMICONDUCTOR PULSE AMPLIFIER
William N. Lawrie, Jr., Wayne, Pa., and Ilan Ziskind, Haifa, Israel, assignors to Burroughs Corporation, Detroit, Mich., a corporation of Michigan
Filed Sept. 17, 1968, Ser. No. 772,443
Int. Cl. H03k 5/01
U.S. Cl. 307—263 12 Claims

ABSTRACT OF THE DISCLOSURE

A pulse shaping and amplifying device which comprises first and second transistor amplifier stages and capacitive timing means coupled respectively between the base and collector of the first stage and between the emitter of the first stage and the collector of the second stage in one embodiment, and coupled respectively between the base and collector of the second stage and between the collector of the first stage and the collector of the second stage in another embodiment. The capacitive timing means controls the conduction levels of the respective transistors thereby controlling the rise and fall times of the leading and trailing edges of the output pulse.

BACKGROUND OF THE INVENTION

Semiconductor pulse amplifying and shaping circuits have been known and utilized in the prior art to meet the need for an accurate, rapidly recovering pulse shaping circuit in electronic computers, testing equipment and practically any other type of electronic device. However, a disadvantage to these prior art devices is that pulses with sharp rise and fall time characteristics can introduce noise in the electronic system as in interconductor coupling in a clock circuit. The sharp rise and fall times of a pulse can also inhibit the use of circuit elements which require slower rise and fall times as exemplified by a trailing edge triggered flip-flop.

SUMMARY OF THE INVENTION

The present invention relates to a semiconductor pulse amplifying and shaping circuit and in particular to such a circuit which includes means to determine the shape of an output pulse. Capacitive timing means and their associated circuitry control the output pulse rise time and the output pulse fall time. By appropriate choice of circuit parameters one can control the output pulse rise time and the output pulse fall time providing a convenient means of obtaining a desired output pulse shape.

It is an object of the present invention to provide a novel and improved pulse amplifying and shaping circuit.

It is a further object of this invention to provide an improved ramp-type waveform generator.

Another object of the invention is to provide a waveform generator which affords precise control over rise and fall times of the waveform.

A further object of the present invention is to provide a novel pulse forming circuit which produces an output pulse, the rise and fall times of the leading and trailing edges thereof being controlled by the use of capacitive timing means.

Another object of the invention is to provide a ramp-type generator whereby the duration of the output pulse may be varied to an unlimited extent.

Other objects and features of the present invention will become apparent from the following detailed description when taken in conjunction with the accompanying drawings in which.

DESCRIPTION OF THE PREFERRED EMBODIMENT

Figure 1:
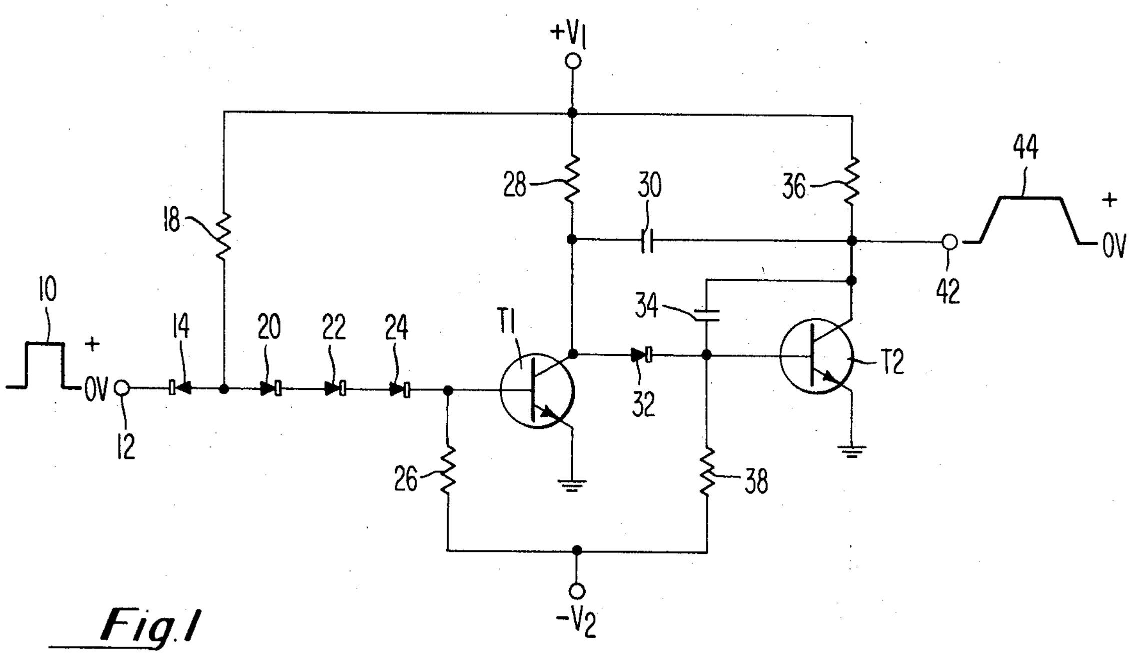
FIG. 1 is a schematic circuit diagram of one embodiment of the invention.

Referring now to FIG. 1, there is shown a positive input pulse 10 applied to an input terminal 12. Terminal 12 is connected to the cathode of diode 14, the anode of which is connected to the anode of diode 20 and to one end of resistor 18, the other end of the resistor is connected to a postive source of potential $V_1$. The diode 20 is connected in series with diodes 22 and 24 with the cathode of diode 20 being connected to the anode of diode 22 and the cathode of diode 22 being connected to the anode of diode 24. The cathode of diode 24 is connected to base of transistor T1 and to a source of negative potential $-V_2$ via resistor 26. The emitter of transistor T1 is connected directly to ground, while the collector thereof is connected to a positive source of potential $+V_1$ via resistor 28, to a plate of capacitor 30 and to the anode of diode 32. The other plate of capacitor 30 is connected to one end of resistor 36, to the collector of transistor T2 and to one plate of capacitor 34. The other end of resistor 36 is connected to $+V_1$. The other plate of capacitor 34 is connected to the cathode of diode 32, to a source of negative potential $-V_2$ via resistor 38 and to the base of transistor T2, the emitter of which is grounded. The collector of transistor T2 is connected to output terminal 42. The output of the collector of transistor T2 appears at terminal 42 and is illustrated by waveform 44.

In operation input pulse 10 is applied to input terminal 12 and thence to the base of transistor T1 via a gating network composed of elements 14, 18, 20, 22, and 24. The gating network determines the voltage level of the input pulse 10 transmitted to T1. Initially, when the input pulse is zero, T1 is reverse-biased while transistor T2 is forward-biased. When the leading edge of input pulse 10 is applied to the circuit, transistor T1 is driven towards saturation. However, the polarity of the initial charge on capacitor 30 delays the collector of transistor T1 from reaching the saturation voltage level by a time delay dependent upon the capacitive discharge rate of capacitor 30. This delayed voltage change in the collector of T1 is fed to the base of transistor T2 via diode 32. The reverse-biasing of transistor T2 is also delayed by the effect of capacitor 34 due to the polarity of its initial charge. The delayed reverse-biasing of transistor T2 is illustrated by the rising ramp portion of waveform 44. The amount of time the output is maintained at the positive voltage level (horizontal portion of the waveform) is determined by the discharge rates of capacitors 30 and 34 and the width of the input pulse 10.

Upon the occurrence of the trailing edge of input pulse 10, transistor T1 tends to return to its initial reversed-biased condition. However, this return is delayed by the effect of the polarity of the charge on capacitor 30, retarding the reverse-biasing of T1. This delayed voltage rise at the collector of T1 is transmitted to the base of transistor T2. The effect of the charge polarity on capacitors 30 and 34 acts to retard the turn-on time of T2. The output appearing at terminal 42 during this time is illustrated by the negative-going ramp portion of wave form 44.

Figure 2:
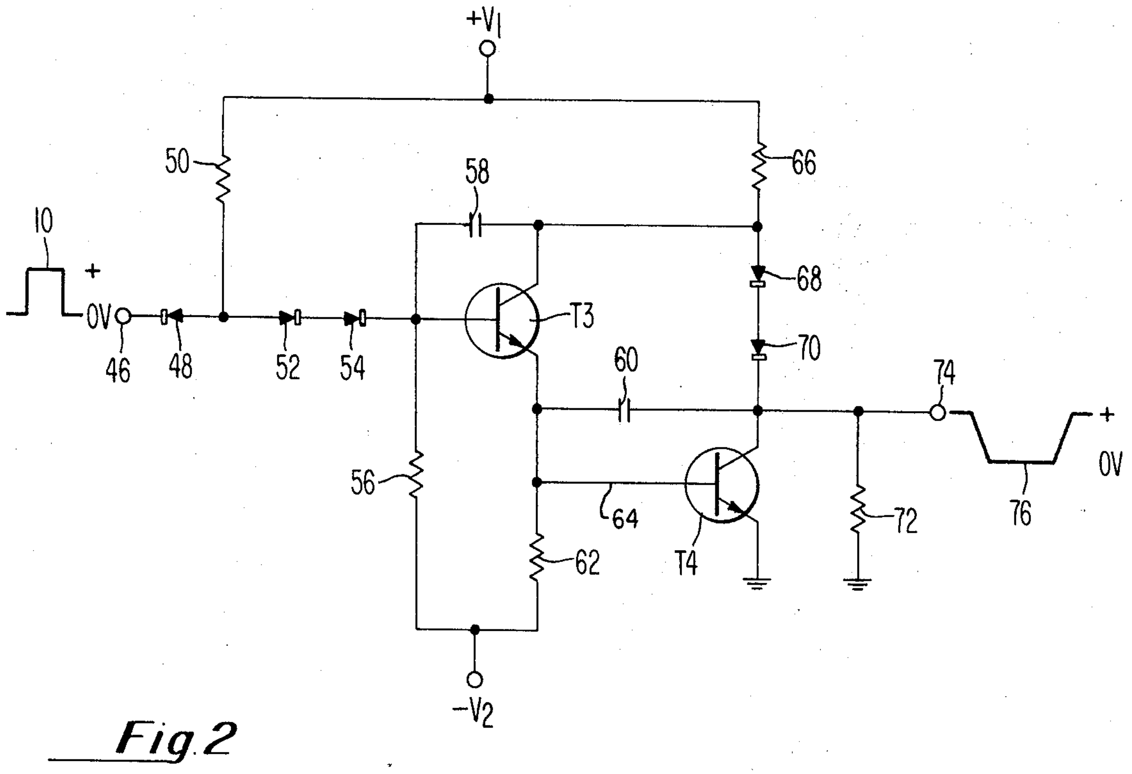
FIG. 2 is a schematic circuit diagram of another embodiment of the invention.

Referring now to the alternate embodiment shown in FIG. 2, the positive input pulse 10 is applied to input terminal 46. The input terminal is connected directly to the cathode of diode 48, the anode thereof being connected to one end of resistor 50 and to the anode of diode 52. The other end of resistor 50 is connected to a positive source of voltage $+V_1$. The cathode of diode 52 in turn is connected to the anode of diode 54, the cathode of which is connected to one end of capacitor 58, to the base of transistor T3, and to one end of resistor 56. The other end of resistor 56 is connected directly to a source of negative potential $-V_2$. The other terminal of capacitor 58 is connected directly to the collector of a NPN transistor T3, T3 being connected in an emitter follower configuration, to the anode of diode 68 and to one end of resistor 66. The emitter of transistor T3 is tied to the collector of NPN transistor T4 via capacitor 60 and directly to the base of T4 via lead 64. The emitter of transistor T3 is also connected to a source of negative potential $-V_2$ via resistor 62. The collector of transistor T4 is connected to the cathode of diode 70, the anode of which is connected to the cathode of diode 68 in a series connection. The anode of diode 68 is connected to a positive source of potential $+V_1$ via resistor 66. The emitter of transistor T4 is grounded. The collector of transistor T4 is connected to ground via load resistor 72 and also to output terminal 74. The output appearing at terminal 74 is shown by waveform 76, illustrating the rise and fall times of the output pulse.

In operation input pulse 10 is applied to input terminal 46 and then to the base of transistor T3 via a gating network composed of elements 48, 50, 52, and 54. The gating network serves to limit the voltage level of input pulse 10. Initially, when the input is zero, T3 is slightly conducting, the relative voltage between its base and emitter being positive. The emitter of transistor T3 is coupled to the base of transistor T4, T4 being reverse-biased thereby. Capacitor 58 is charged to a value determined by source $V_1$, source $-V_2$, resistor 66, diodes 68 and 70, resistor 72, resistor 62, and the voltage drop between the base of T3 and ground. Capacitor 60 is charged from a current path which includes ground, resistor 72, T3, resistor 66 and $+V_1$. The initial output voltage appearing at terminal 74 is shown by waveform 76 to be positive.

Upon the occurrence of the leading edge of pulse 10, transistor T3 normally would be biased to saturation. However, the saturation of transistor T3 is delayed by the charge polarity on capacitor 58 which tends to retard the saturation time. The delay time is a function of the discharge time constant of the circuit which includes capacitor 58. Since T3 is connected in an emitter follower configuration, the voltage appearing at the emitter of T3 is approximately equal to the voltage pulse appearing at the base of T3, but delayed by the action of capacitor 58. This delay pulse tends to bias transistor T4 to saturation. However transistor T4 is retarded from entering saturation by the charge on capacitor 60 and the rate at which T4 enters saturation is determined by the discharge time constant of the circuit which includes capacitor 60. When transistor T4 is driven into the saturation region, the voltage appearing at the collector of transistor T4 is approximately zero. The negative going ramp portion of the waveform 76 shows the output of the circuit as T4 is biased towards saturation while the horizontal portion of the waveform represents the output when T4 reaches saturation. The negative going edge of input pulse 10 appears at the base of transistor T3 and tends to drive the transistor back to its initial, slightly conducting state. However, the rate at which T3 approaches this condition is again determined by the charge rate of capacitor 58, as discussed above. The output appearing at the emitter of transistor T3 is coupled directly to the base of transistor T4 and the rate at which T4 returns to its reverse-biased state is determined by the charge rate of capacitor 60. This retards the turn-off of T4. The output appearing at the collector of T4 and at output terminal 74 is shown by the positive going ramp portion of waveform 76. This portion rises to the initial steady state positive voltage value.

Our invention has been described in the environment of a pulse shaping and amplifying circuit. It is obvious, however, that the rise time and fall time of the output waveform can be controlled by varying the charge and discharge rates of the capacitive coupling in any circuit which generates an output pulse or waveform as a function of an input signal. Our invention, therefore, should only be limited by the scope of the appended claims.

What is claimed is:

1. A waveform generator comprising:

first switching means having an input terminal and an output terminal and adapted to be actuated by a voltage pulse to change the initial voltage level of said output terminal, second switching means having an input terminal and an output terminal and adapted to be actuated in a manner such that said voltage pulse will change the initial voltage level of its output terminal, means for biasing each of said switching means to said voltage levels, a first capacitor coupled between said output terminals of said first and second switching means, a second capacitor coupled between said output and input terminals of said second switching means, rectifier means connected between the output terminal of said first switching means and the input terminal of said second swtching means, and output means coupled to the output terminal of said second switching means for deriving an output voltage signal in response to an input voltage signal applied to the input terminal of said first switching means.

2. The waveform generator as defined in claim 1 wherein said first and second switching means each comprise a transistor having base, collector and emitter electrodes.

3. The waveform generator as defined in claim 2 wherein said first capacitor is coupled between the collector electrodes of each transistor and said second capacitor is coupled between the base and collector electrodes of said second transistor.

4. The waveform generator as defined in claim 3 wherein said biasing means reverse-biases said first transistor and biases said second transistor to a normally conductive state.

5. The waveform generator as defined in claim 4 wherein said rectifier means is coupled between the collector electrode of said first transistor and the base electrode of said second transistor.

6. The waveform generator of claim 5 wherein said first and second transistors are arranged in a grounded emitter configuration.

7. A waveform generator comprising:

first switching means having an input terminal and first and second output terminals and adapted to be actuated by a voltage pulse to change the initial voltage level of said output terminals, second switching means having an input terminal and an output terminal and adapted to be actuated in a manner such that said voltage pulse will change the initial voltage level of its output terminal, means for biasing each of said switching means to said initial voltage levels, a first capacitor coupled between said input and said first output terminals of said first switching means, a second capacitor coupled between said input and output terminals of said second switching means, rectifier means connected between said first output terminal of said first switching means and the output terminal of said second switching means, and output means coupled to the output terminal of said second switching means for deriving an output voltage signal in response to an input voltage signal applied to the input terminal of said first switching means.

8. The waveform generator as defined in claim 7 wherein said first and second switching means each comprise a transistor having base, collector and emitter electrodes.

9. The waveform generator as defined in claim 8 wherein said first capacitor is connected between the collector and base electrodes of said first transistor and said second capacitor is connected between said base and collector electrodes of said second transistor.

10. The waveform generator as defined in claim 9 wherein said biasing means biasers said first transistor to a normally conductive state and reverse-biases said second transistor.

11. The waveform generator as defined in claim 10 wherein said first transistor is arranged in an emitter follower configuration and said second transistor is arranged in a ground emitter configuration.

12. The waveform generator as defined in claim 11 wherein said rectifier means is connected between the collector electrodes of said first and second transistors.

References Cited

UNITED STATES PATENTS 3,444,394 5/1969 Colvson ........... 307—228X

ROY LAKE, Primary Examiner

J. B. MULLINS, Assistant Examiner

U.S. Cl. X.R.

307—268; 328—34